US009425818B1

(12) United States Patent
Rajaee et al.

(10) Patent No.: US 9,425,818 B1
(45) Date of Patent: Aug. 23, 2016

(54) NOISE SHAPING SUCCESSIVE APPROXIMATION REGISTER ANALOG-TO-DIGITAL CONVERTER

(71) Applicant: QUALCOMM Incorporated, San Diego, CA (US)

(72) Inventors: Omid Rajaee, San Diego, CA (US); Dinesh Jagannath Alladi, San Diego, CA (US); Liang Dai, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/724,555

(22) Filed: May 28, 2015

(51) Int. Cl.
*H03M 3/00* (2006.01)

(52) U.S. Cl.
CPC ............... *H03M 3/426* (2013.01); *H03M 3/32* (2013.01)

(58) Field of Classification Search
CPC .................................................. H03M 3/426
See application file for complete search history.

(56) References Cited

U.S. PATENT DOCUMENTS

| 8,102,292 | B1 * | 1/2012 | Van Ess | H03M 3/426 341/143 |
|---|---|---|---|---|
| 8,860,600 | B1 | 10/2014 | Yang | |
| 8,928,511 | B2 | 1/2015 | Lin et al. | |
| 8,947,285 | B2 | 2/2015 | Ceballos | |
| 9,197,240 | B1 * | 11/2015 | Kinyua | H03M 1/468 |
| 2015/0009058 | A1 | 1/2015 | Nentwig et al. | |
| 2015/0023415 | A1 | 1/2015 | Kerner et al. | |

OTHER PUBLICATIONS

Kim et al., nth-order multi-bit SD ADC using SAR quantiser, Electronics Letters, vol. 46 No. 19, Sep. 16, 2010.*
Chen et al., Noise Shaping Implementation in Two-Step/SAR ADC Architectures Based on Delayed Quantization Error, 2011 IEEE 54th International Midwest Symposium on Circuits and Systems, Aug. 2011.*
Liu et al., A 92.4dB SNDR 24kHz ΔΣ Modulator Consuming 352 μW, IEEE, 2011 Internatonal Symposium of Low Power Electronics and Design, Aug. 2011.*
Jeffery Fredenburg and Michael Flynn, ISSCC 2012/Session 27/Data Converter Techniques/27.6, 27.6 A 90MS/s 11MHz Bandwidth 62dB SNDR Noise-Shaping SAR ADC, 2012 IEEE International Solid-State Circuits Conference, 3 pages. University of Michigan, Ann Arbor, MI.

* cited by examiner

*Primary Examiner* — Howard Williams
(74) *Attorney, Agent, or Firm* — Procopio, Cory, Hargreaves & Savitch, LLP

(57) ABSTRACT

An analog-to-digital converter includes: a first input terminal to receive a first input signal; a second input terminal to receive a second input signal; a noise shaping module configured to compare the first input signal to the second input signal received, and to output a digital output signal and a residue signal in a first phase of a noise shaping operation; and a storage module configured to store the residue signal during the first phase of the noise shaping operation, the storage module configured to receive an analog input signal and remove the residue signal from the analog input signal in a second phase of the noise shaping operation to output a new first input signal to the noise shaping module.

27 Claims, 9 Drawing Sheets

NOISE SHAPING SUCCESSIVE APPROXIMATION REGISTER ANALOG-TO-DIGITAL CONVERTER

BACKGROUND

1. Field

This disclosure relates generally to analog-to-digital converters, and more specifically, to a full first-order noise shaping successive approximation register analog-to-digital converter.

2. Background

Successive approximation register (SAR) analog-to-digital converters (ADCs) are widely used in various applications that may require low power and area efficient ADCs. Recently, SAR ADC has acquired more attention due to improved capacitor matching and availability of metal capacitors with very small unit sizes (e.g., sub-femto-Farad capacitors are available in modern complementary metal oxide semiconductor (CMOS) technologies).

FIG. 1 is a functional block diagram of a SAR ADC 100 in which an analog input voltage (Vin) is sampled by a switch 110 when the clock is high and the conversion is started when the clock goes low and the input voltage is disconnected. Initially, a binary search is performed by a comparator 130 and a SAR logic unit 140 to find a digital output. To resolve n+1 bits, n digital-to-analog converter (DAC) operations are performed by a DAC 120. Thus, the digital output (Dout) is a digital representation of the analog input voltage including any quantization noise (Q).

If one additional DAC operation is performed (i.e., n+1 DAC operations), the final residue stored on the capacitor array of the DAC is equal to the quantization noise. Thus, in a SAR architecture, which uses the capacitor array as the DAC, the quantization noise of each conversion can be extracted at the end of the conversion from the capacitor array analog residue remaining from the SAR operation.

FIG. 2 is a functional block diagram of a SAR ADC 200 including one implementation of a noise shaping. In FIG. 2, an analog input voltage (Vin) is sampled by a switch 210 when the clock is high and the conversion is started when the clock goes low and the input voltage is disconnected. A binary search is performed by a comparator 230 and a SAR logic unit 240 to find a digital output. In FIG. 2, n+1 DAC operations are performed by a DAC 220. A quantization noise is left on the capacitor array of the DAC 220 after the (n+1)$^{th}$ DAC operation. The noise shaping is performed by offsetting a reference voltage (Vref) by the quantization noise of the previous conversion (i.e., the residue left on the capacitor array). The noise shaping is in the form of $$\frac{1}{1+z^{-1}}$$

as shown below in Equations (1), (2), and (3):

$$D_{out}(k) = V_{in}(k) + Q(k) - V_{res}(k-1), \text{ where} \quad (1)$$

$$V_{res}(k) = D_{out}(k) - V_{in}(k), \quad (2)$$

$$D_{out}(z) = V_{in}(z) + \frac{1}{1+z^{-1}} * Q(z). \quad (3)$$

However, this provides only 6-dB improvement at DC and may require more complex hardware as compared to adding one extra bit (which also provides 6-dB improvement).

SUMMARY

The present disclosure describes a full first-order noise shaping successive approximation register (SAR) analog-to-digital converter (ADC) which provides noise shaping in the form of $(1-z^{-1})$.

In one embodiment, an ADC is disclosed. The ADC includes: a first input terminal to receive a first input signal; a second input terminal to receive a second input signal; a noise shaping module configured to compare the first input signal to the second input signal received, and to output a digital output signal and a residue signal in a first phase of a noise shaping operation; and a storage module configured to store the residue signal during the first phase of the noise shaping operation, the storage module configured to receive an analog input signal and remove the residue signal from the analog input signal in a second phase of the noise shaping operation to output a new first input signal to the noise shaping module.

In another embodiment, a SAR loop configured to perform noise shaping in an ADC is disclosed. The SAR loop includes: a comparator including first and second input terminals configured to receive first and second input signals, and an output terminal configured to output an output signal; a SAR logic unit coupled to the output terminal of the comparator and configured to perform a noise shaping operation on the output signal until only a residue signal is left on the first input terminal; and a storage module configured to store the residue signal during a first phase of the noise shaping operation, the storage module configured to receive an analog input signal and remove the residue signal from the analog input signal in a second phase of the noise shaping operation to output a new first input signal to the first input terminal In yet another embodiment, a sigma-delta modulator (SDM) is disclosed. The SDM includes: a loop filter configured to receive and integrate an input signal and output a first integrated signal; and a quantizer including: a noise shaping module configured to receive the first integrated signal and output a quantization error signal in a noise shaping operation; and a sample-and-hold module configured to store the quantization error signal during a first phase of the noise shaping operation, the sample-and-hold module configured to receive a second integrated signal from the loop filter and remove the quantization error signal from the second integrated signal in a second phase of the noise shaping operation.

In yet another embodiment, a method for performing noise shaping in an analog-to-digital converter (ADC) is disclosed. The method includes: comparing a first received input signal to a second received input signal using a noise shaping module; outputting, by the noise shaping module, a digital output signal and a residue signal in a first phase of a noise shaping operation; storing the residue signal during the first phase of the noise shaping operation in a storage module; and removing the residue signal from a received analog input signal in a second phase of the noise shaping operation to output a new first input signal.

In yet another embodiment, an apparatus for performing noise shaping in an analog-to-digital converter (ADC) is disclosed. The apparatus includes: means for comparing a first received input signal to a second received input signal using a noise shaping module; means for outputting, by the noise shaping module, a digital output signal and a residue signal in a first phase of a noise shaping operation; means for storing the residue signal during the first phase of the noise shaping operation in a storage module; and means for removing the residue signal from a received analog input signal in a second phase of the noise shaping operation to output a new first input signal. The apparatus further includes: means for performing digital-to-analog converter (DAC) operations on the digital output signal until only the residue signal is left on a DAC of the noise shaping module.

Other features and advantages of the present disclosure should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

Implementing noise shaping for a SAR ADC may reduce the in-band quantization noise (e.g., in oversampling applications) and may significantly improve the signal-to-quantization-noise ratio (SQNR) with minimal hardware. As shown above, the noise shaping can be achieved by shifting the reference voltage of the SAR ADC by the amount of quantization noise from its previous conversion. However, the noise shaping achieved using this approach is in the form of $$\frac{1}{1+z^{-1}}$$

which provides maximum of 6-dB quantization noise attenuation at DC and may require complicated filtering of the out-of-band noise.

Figure 1:
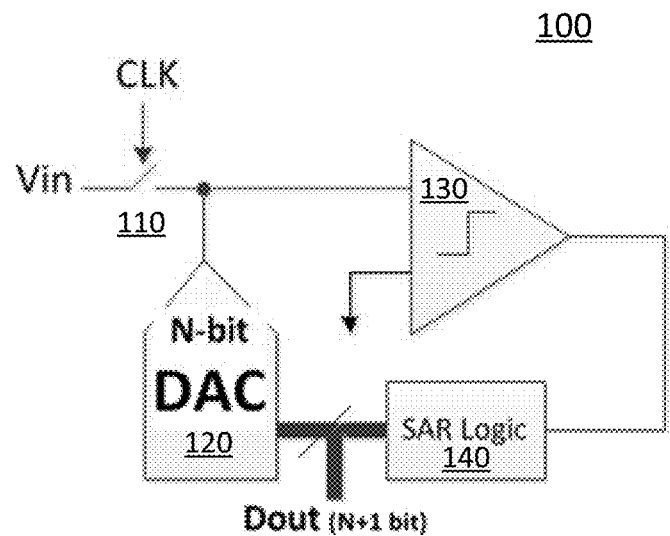
FIG. 1 is a functional block diagram of a SAR ADC.
Figure 2:
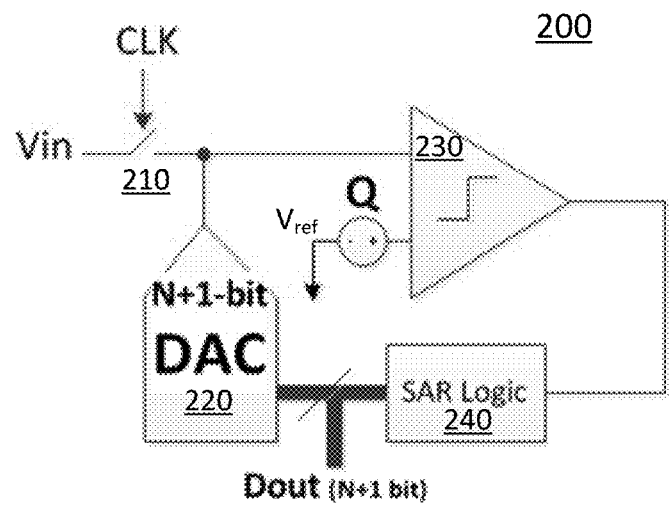
FIG. 2 is a functional block diagram of a SAR ADC including one implementation of a noise shaping.
Figure 3:
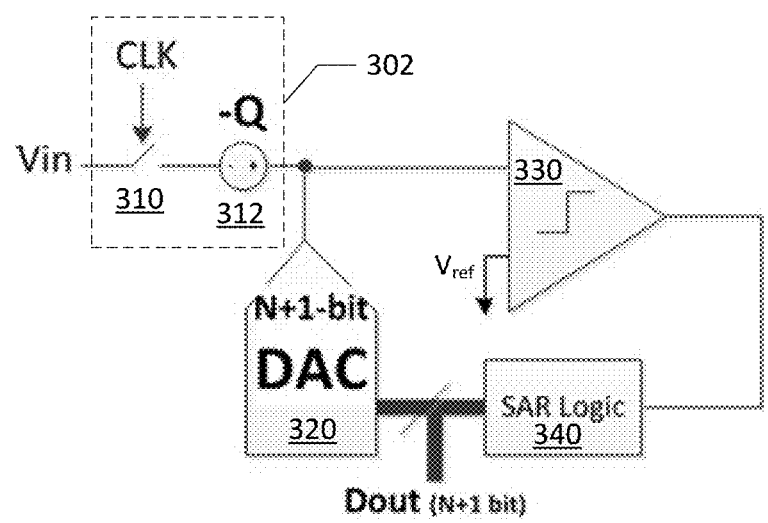
FIG. 3 is a functional block diagram of a full first-order noise shaping SAR ADC which provides noise shaping in the form of $(1-z^{-1})$ in accordance with one embodiment of the present disclosure.

FIG. 3 is a functional block diagram of a full first-order noise shaping SAR ADC 300 which provides noise shaping in the form of $(1-z^{-1})$ in accordance with one embodiment of the present disclosure. In FIG. 3, the full first-order noise shaping SAR ADC 300 may be implemented without complicated filtering of the out-of-band noise.

In the illustrated embodiment of FIG. 3, an analog input voltage ($V_{in}$) is sampled by a switch 310 when the clock goes high and the conversion is started when the clock goes low and the switch 310 disconnects the input voltage. A binary search is performed by a comparator 330 and a SAR logic unit 340 to find a digital output. In FIG. 3, n+1 DAC operations are performed by a DAC 320. A quantization noise is left on the capacitor array of the DAC 320 after the $(n+1)^{th}$ DAC operation. The full first-order noise shaping is enabled by offsetting the analog input voltage ($V_{in}$) by the quantization noise 312 (i.e., the residue left on the capacitor array) of the previous phase (see Equation (5) below). Thus, a sample-and-store module 302 is configured to store the quantization noise 312 from the previous phase such that the quantization noise 312 can be removed from the analog input voltage in the current phase. The noise shaping of FIG. 3 is in the form of $(1-z^{-1})$ as shown below in Equations (4), (5), and (6):

$$D_{out}(k)=V_{in}(k)+Q(k)-V_{res}(k-1), \quad (4)$$

$$\text{where } V_{res}(k)=D_{out}(k)-(V_{in}(k)-V_{res}(k-1)), \quad (5)$$

$$D_{out}(z)=V_{in}(z)+(1-z^{-1})*Q(z). \quad (6)$$

Figure 4A:
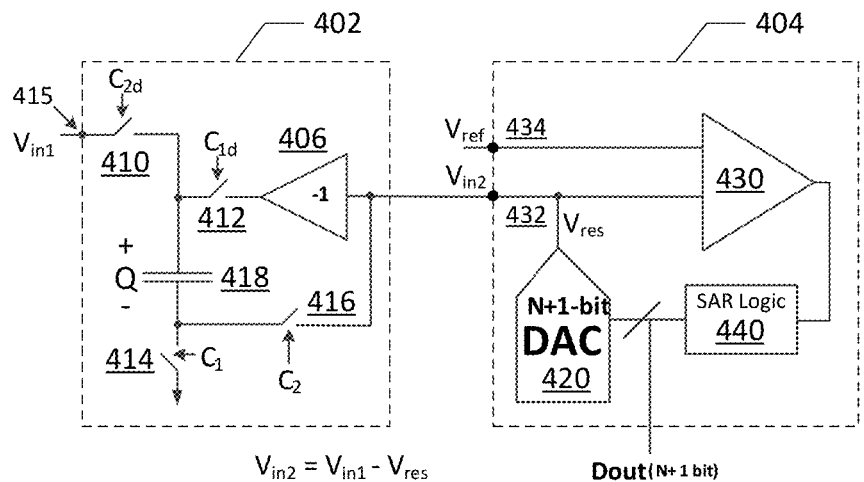
FIG. 4A is a functional block diagram of a full first-order noise shaping SAR ADC in accordance with one embodiment of the present disclosure.

FIG. 4A is a functional block diagram of a full first-order noise shaping SAR ADC 400 in accordance with one embodiment of the present disclosure. In one embodiment, the SAR ADC 400 is a detailed implementation of FIG. 3.

In the illustrated embodiment of FIG. 4A, the noise shaping SAR ADC 400 includes a noise shaping module 404 which compares a first input signal ($V_{in2}$) received at a first input terminal 432 to a second input signal ($V_{ref}$) received at a second input terminal 434. The noise shaping module 404 also outputs a digital output signal ($D_{out}$) and a residue signal ($V_{res}$) in a noise shaping operation. A binary search is performed by a comparator 430 and a SAR logic unit 440 to find a digital output signal ($D_{out}$). In FIG. 4A, n+1 DAC operations are performed by a DAC 420. A quantization noise is left on the capacitor array of the DAC 420 after the $(n+1)^{th}$ DAC operation. The noise shaping SAR ADC 400 also includes a storage module 402 which stores the residue signal ($V_{res}$) during a first phase of the noise shaping operation. The storage module 402 also receives an analog input signal ($V_{in1}$) at an input node 415 and removes the residue signal ($V_{res}$) from the analog input signal ($V_{in1}$) in a second phase of the noise shaping operation to output the first input signal ($V_{in2}$) to the noise shaping module 404.

Figure 4B:
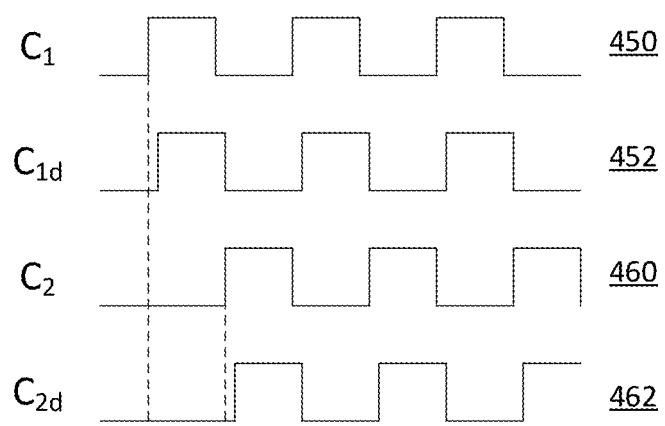
FIG. 4B shows timing diagrams illustrating clocks operating to control switches in the storage module during first and second phases.

FIG. 4B shows timing diagrams illustrating clocks operating to control switches 410, 412, 414, 416 in the storage module during first and second phases. Timing diagram 450 shows first phase clock pulse C1. Timing diagram 452 shows first phase delayed clock pulse C1d. Timing diagram 460 shows second phase clock pulse C2. Timing diagram 462 shows second phase delayed clock pulse C2d.

Referring back to FIG. 4A, the residue signal ($V_{res}$) output on the first input terminal 432 at the end of an n+1 bit DAC operation is buffered onto a buffer 406. As the SAR ADC 400 enters the first phase of the ADC operation, switch 414 is activated by the clock signal C1 and then switch 412 is activated by the delayed clock signal C1d. This allows the residue signal ($V_{res}$) buffered on the buffer 406 to be stored onto a residue capacitor 418. In one embodiment, the buffer 406 acts to isolate the residue capacitor 418 from the capacitors of the DAC 420. In the second phase of the ADC operation, switches 412, 414 are deactivated and switches 416, 410 are activated in sequence by the clock signals C2, C2d. Thus, switches 416, 410 configure the storage module 402 such that the residue capacitor 418 is in series with the analog input signal ($V_{in1}$). Since the activation of switches 416, 410 couples the residue capacitor 418 (which stores the residue signal ($V_{res}$)) with the analog input signal ($V_{in1}$) and the first input terminal 432 of the noise shaping module 404, this configuration has the effect of removing the residue signal ($V_{res}$) from the analog input signal ($V_{in1}$) and outputting the difference as the first input signal ($V_{in2}$) for the next phase. It should be noted that some of the elements used in the storage module 402 can be replaced with other alternative elements. For example, the buffer 406 can be replaced with a source follower transistor having a gate terminal as an input terminal and a source terminal as an output terminal. Further, switches 410, 412, 414, 416 can be replaced with transistor-based switches.

Following connections are made in FIG. 4A: switch 412 is coupled to the buffer 406 and a first node (+ node) of the residue capacitor 418; switch 416 is coupled to the first input terminal 432 and a second node (− node) of the residue capacitor 418; switch 410 is coupled to the input node 415 and the first node of the residue capacitor 418; and switch 414 is coupled to the second node of the residue capacitor 418 and a ground voltage.

Figure 5:
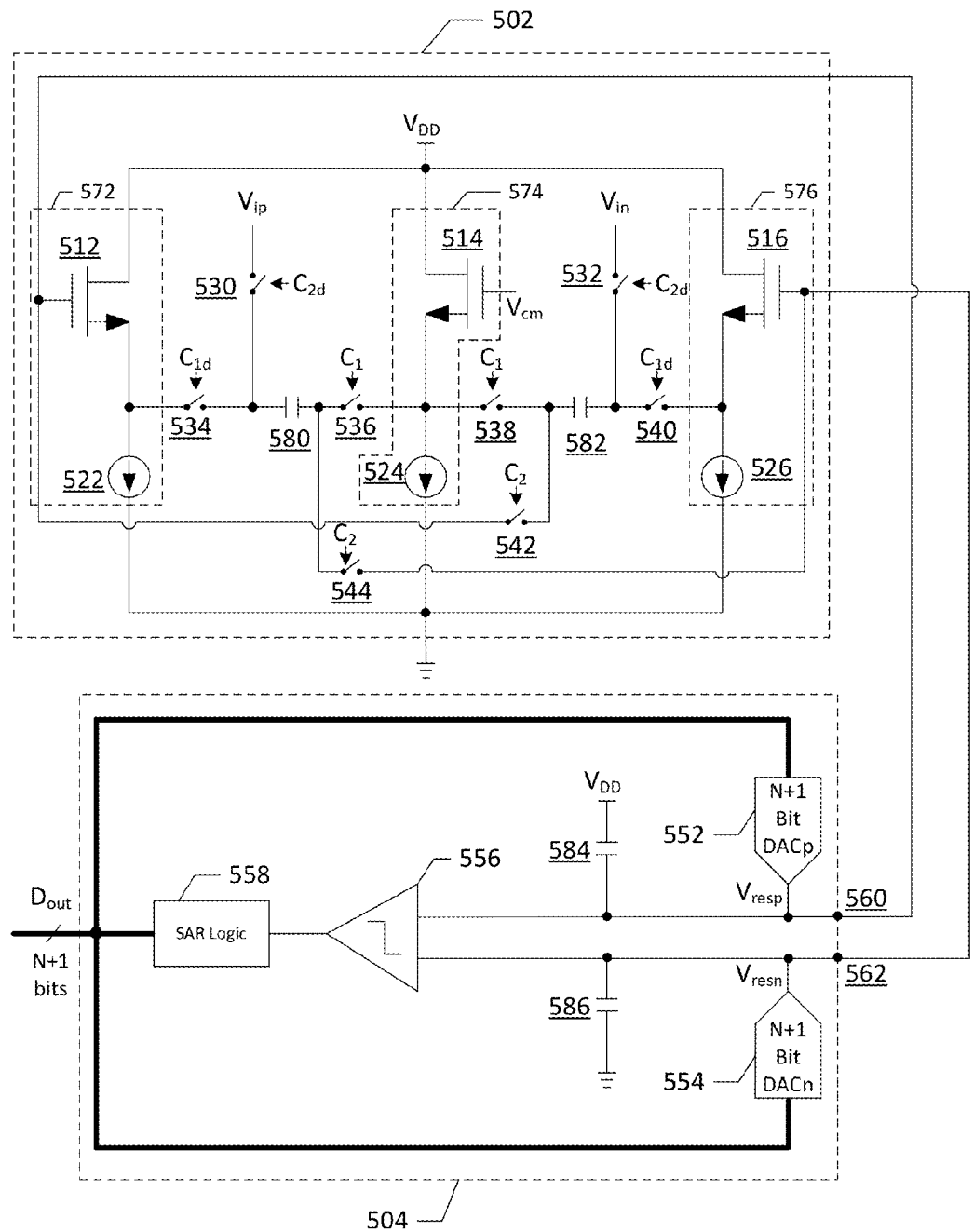
FIG. 5 is a circuit diagram of a SAR ADC in accordance with one embodiment of the present disclosure.

FIG. 5 is a circuit diagram of a SAR ADC 500 in accordance with one embodiment of the present disclosure. In one embodiment, the SAR ADC 500 of FIG. 5 is a differential circuit implementation of FIG. 4A.

In the illustrated embodiment of FIG. 5, the noise shaping SAR ADC 500 includes a noise shaping module 504 which compares a first input signal received at a first input terminal 560 to a second input signal received at a second input terminal 562. The first and second input signals form a differential signal. The noise shaping module 504 also outputs a digital output signal ($D_{out}$) and a pair of residue signals ($V_{resp}$ and $V_{resn}$) in a noise shaping operation. A binary search is performed by a comparator 556 and a SAR logic unit 558 to find a digital output signal ($D_{out}$). In FIG. 5, two n+1 DAC operations are performed by a DAC for a positive signal (DACp) 552 and a DAC for a negative signal (DACn) 554. A quantization noise is left on each of the capacitor arrays of the DACp 552 and the DACn 554 after the $(n+1)^{th}$ DAC operation. The SAR ADC 500 also includes a storage module 502 which stores the residue signals ($V_{resp}$ and $V_{resn}$) during a first phase of the noise shaping operation and removes the residue signals ($V_{resp}$ and $V_{resn}$) stored during the first phase from analog differential input signals ($V_{ip}$ and $V_{in}$) in a second phase of the noise shaping operation. The results are output to the first and second input terminals 560, 562 as the first and second input signals.

In the storage module 502, a transistor 512 and a current sink 522 form a first source follower buffer 572 for the first input signal (i.e., the positive input of the differential signals) and a transistor 516 and a current sink 526 form a second source follower buffer 576 for the second input signal (i.e., the negative input of the differential signals). One additional source follower buffer 574 is formed by a transistor 514 and a current sink 524 to provide a common-mode signal for the pair of differential signals. The storage module 502 also includes residue capacitors 580, 582 which store the residue signals ($V_{resp}$ and $V_{resn}$) output by the DACp 552 and the DACn 554 after the $(n+1)^{th}$ DAC operation. The residue capacitors 580, 582 may be significantly larger (e.g., ten times larger) than the total capacitance on the differential input nodes (i.e., first and second input terminals 560, 562) which can substantially reduce the coefficient mismatch. Thus, the residue capacitors 580, 582 do not need to be of the same type as the capacitors for the DACp 552, DACn 554. Further, the area penalty is relatively small compared to the size of the SAR ADC. In some embodiments, additional external capacitors 584, 586 can be coupled to the first and second input terminals 560, 562.

In operation, the residue signals ($V_{resp}$ and $V_{resn}$) output on the first input terminal 560 and the second input terminal 562, respectively, at the end of the two n+1 bit DAC operations (performed by DACp 552 and DACn 554, respectively) are buffered onto the first source follower buffer 572 and the second source follower buffer 576, respectively. That is, the first residue signal ($V_{resp}$) is buffered on the transistor 512, while the second residue signal ($V_{resn}$) is buffered on the transistor 516. As the SAR ADC 500 enters the first phase of the ADC operation, switches 536, 538 are activated by the clock signal C1 and then switches 534, 540 are activated by the delayed clock signal C1d. This allows the residue signals ($V_{resp}$ and $V_{resn}$) buffered on the transistors 512, 516 to be stored onto the residue capacitors 580, 582. In the second phase of the ADC operation, switches 534, 536, 538, 540 are deactivated and switches 542, 544, 530, 532 are activated in sequence by the clock signals C2, C2d. Thus, switches 542, 544, 530, 532 configure the storage module 502 such that the residue capacitors 580, 582 are in series with the analog differential input signals ($V_{ip}$ and $V_{in}$). Since the activation of switches 542, 544, 530, 532 couples the residue capacitors 580, 582 (which store the residue signals ($V_{resp}$ and $V_{resn}$)) with the analog differential input signals ($V_{ip}$ and $V_{in}$) and the first and second input terminals 560, 562, respectively, of the noise shaping module 504, this configuration has the effect of removing the residue signals ($V_{resp}$ and $V_{resn}$) from the analog differential input signals ($V_{ip}$ and $V_{in}$) and outputting the differences as the first and second input signals for the next phase. It should be noted that some of the elements used in the storage module 502 can be replaced with other alternative elements. For example, each of the source follower buffers 572, 574 can be replaced with a buffer circuit having an input terminal and an output terminal. Further, switches 530, 532, 534, 536, 538, 540, 542, 544 can be replaced with transistor-based switches.

Figure 6:
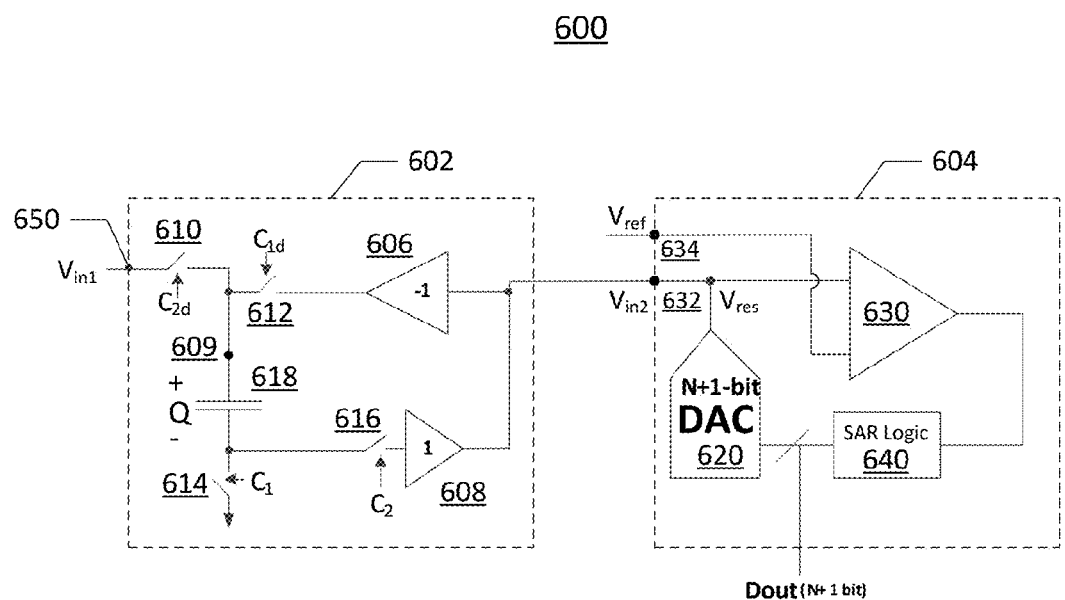
FIG. 6 is a functional block diagram of a noise shaping SAR ADC in accordance with another embodiment of the present disclosure.

FIG. 6 is a functional block diagram of a noise shaping SAR ADC 600 in accordance with another embodiment of the present disclosure. In the illustrated embodiment of FIG. 6, the noise shaping SAR ADC 600 includes a noise shaping module 604 which compares a first input signal ($V_{in2}$) received at a first input terminal 632 to a second input signal ($V_{ref}$) received at a second input terminal 634. The noise shaping module 604 also outputs a digital output signal ($D_{out}$) and a residue signal ($V_{res}$) in a noise shaping operation. A binary search is performed by a comparator 630 and a SAR logic unit 640 to find a digital output signal ($D_{out}$). In FIG. 6, n+1 DAC operations are performed by a DAC 620. A quantization noise is left on the capacitor array of the DAC 620 after the $(n+1)^{th}$ DAC operation. The noise shaping SAR ADC 600 also includes a storage module 602 which stores the residue signal ($V_{res}$) during a first phase of the noise shaping operation. The storage module 602 also receives an analog input signal ($V_{in1}$) and removes the residue signal ($V_{res}$) from the analog input signal ($V_{in1}$) in a second phase of the noise shaping operation to output the first input signal ($V_{in2}$) to the noise shaping module 604.

In FIG. 6, the residue signal ($V_{res}$) output on the first input terminal 632 at the end of an n+1 bit DAC operation is buffered onto a buffer 606. As the SAR ADC 600 enters the first phase of the ADC operation, switch 614 is activated by the clock signal C1 and then switch 612 is activated by the delayed clock signal C1d. This allows the residue signal ($V_{res}$) buffered on the buffer 606 to be stored onto a residue capacitor 618. In one embodiment, the buffer 606 acts to isolate the residue capacitor 618 from the capacitors of the DAC 620. In the second phase of the ADC operation, switches 612, 614 are deactivated and switches 616, 610 are activated in sequence by the clock signals C2, C2d. In the storage module 602 of FIG. 6, a buffer 608 is disposed between switch 616 and the first input terminal 632. While the buffer 606 is used in the first phase, the buffer 608 is used in the second phase. In the illustrated embodiment of FIG. 6, by adding the buffer 608, the size of the residue capacitor 618 can be significantly reduced (e.g., by at least a factor of 5). Adding an additional buffer 608 may not impose overall higher power consumption because the addition of the buffer 608 enables the size of the buffer 606 to be reduced and thus the power consumed by the buffer 606 may be reduced. Further, the addition of the buffer 608 may reduce the effective input load of the SAR ADC 600.

The activation of switches 616, 610 configures the storage module 602 such that the residue capacitor 618 is in series with the analog input signal ($V_{in1}$), which is received at the input terminal 650 of the SAR ADC 600. Since the activation of switches 616, 610 couples the residue capacitor 618 (which stores the residue signal ($V_{res}$)) with the analog input signal ($V_{in1}$) and the first input terminal 632 through the buffer 608, this configuration has the effect of removing the residue signal ($V_{res}$) from the analog input signal ($V_{in1}$) and buffering/outputting the difference as the first input signal ($V_{in2}$) for the next phase.

Figure 7:
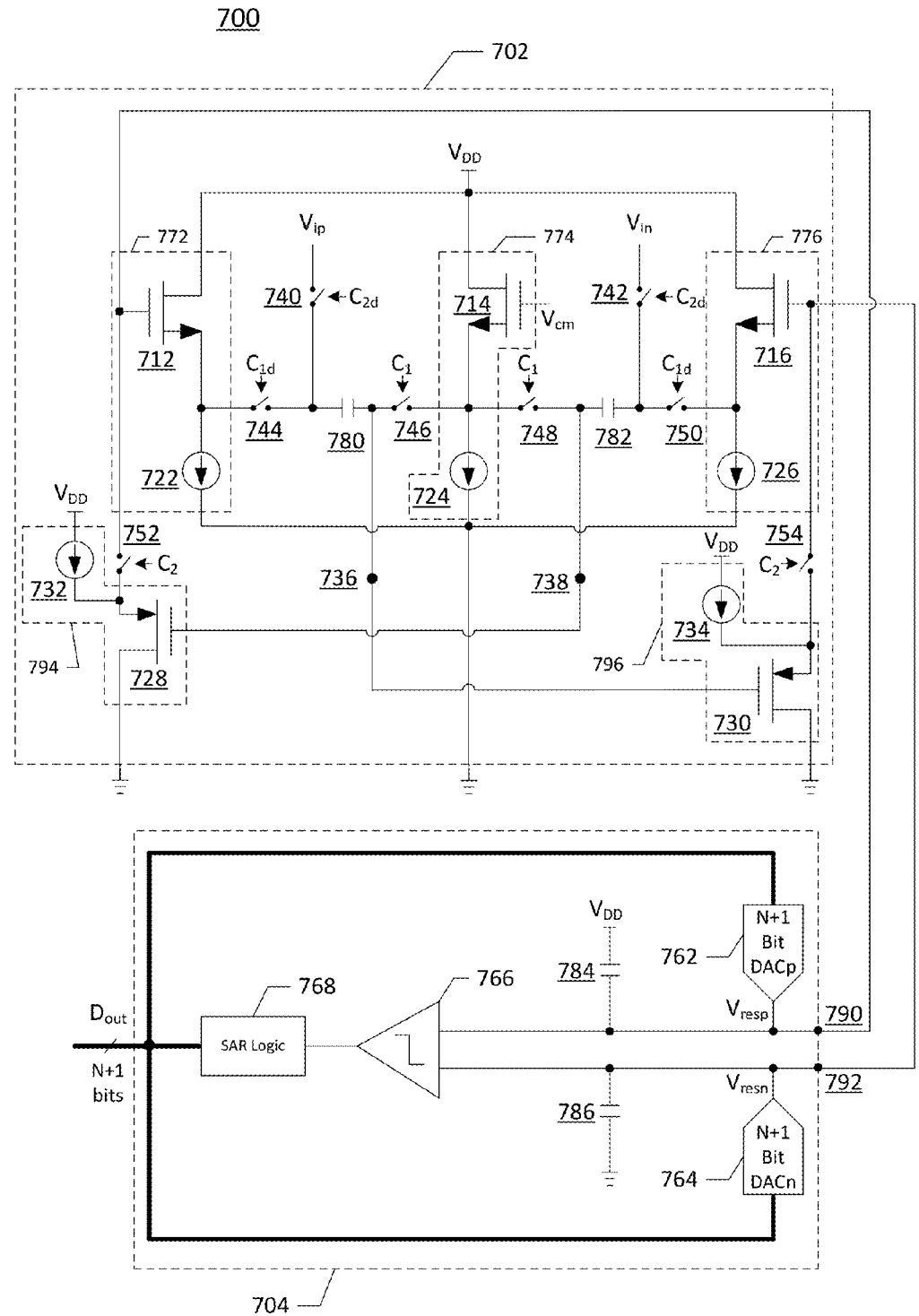
FIG. 7 is a circuit diagram of a SAR ADC in accordance with one embodiment of the present disclosure.

FIG. 7 is a circuit diagram of a SAR ADC 700 in accordance with one embodiment of the present disclosure. In one embodiment, the SAR ADC 700 of FIG. 7 is a differential circuit implementation of a SAR ADC 600 in FIG. 6.

In the illustrated embodiment of FIG. 7, the noise shaping SAR ADC 700 includes a noise shaping module 704 which compares a first input signal received at a first input terminal 790 to a second input signal received at a second input terminal 792. The first and second input signals form a differential signal. The noise shaping module 704 also outputs a digital output signal ($D_{out}$) and a pair of residue signals ($V_{resp}$ and $V_{resn}$) in a noise shaping operation. A binary search is performed by a comparator 766 and a SAR logic unit 768 to find a digital output signal ($D_{out}$). In FIG. 7, two n+1 bit DAC operations are performed by a DAC for a positive signal (DACp) 762 and a DAC for a negative signal (DACn) 764. A quantization noise is left on each of the capacitor arrays of the DACp 762 and the DACn 764 after the (n+1)$^{th}$ DAC operation. The SAR ADC 700 also includes a storage module 702 which stores the residue signals ($V_{resp}$ and $V_{resn}$) during a first phase of the noise shaping operation and removes the residue signals ($V_{resp}$ and $V_{resn}$) stored during the first phase from analog differential input signals ($V_{ip}$ and $V_{in}$) in a second phase of the noise shaping operation. The results are output to the first and second input terminals 790, 792 as the first and second input signals.

In the storage module 702, a transistor 712 and a current sink 722 form a first source follower buffer 772 for the first input signal (i.e., the positive input of the differential signals) and a transistor 716 and a current sink 726 form a second source follower buffer 776 for the second input signal (i.e., the negative input of the differential signals). One additional source follower buffer 774 is formed by a transistor 714 and a current sink 724 to provide a common-mode signal for the pair of differential signals. The storage module 702 also includes residue capacitors 780, 782 which store the residue signals ($V_{resp}$ and $V_{resn}$) output by the DACp 762 and the DACn 764 after the (n+1)$^{th}$ DAC operation. The residue capacitors 780, 782 may be significantly larger (e.g., ten times larger) than the total capacitance on the differential input nodes (i.e., first and second input terminals 790, 792) which can substantially reduce the coefficient mismatch. Thus, the residue capacitors 780, 782 do not need to be of the same type as the capacitors for the DACp 762, DACn 764. Further, the area penalty is relatively small compared to the size of the SAR ADC. In some embodiments, additional external capacitors 784, 786 can be coupled to the first and second input terminals 790, 792.

In operation, the residue signals ($V_{resp}$ and $V_{resn}$) output on the first input terminal 790 and the second input terminal 792, respectively, at the end of the two n+1 bit DAC operations (performed by DACp 762 and DACn 764, respectively) are buffered onto the first source follower buffer 772 and the second source follower buffer 776, respectively. That is, the first residue signal ($V_{resp}$) is buffered on the transistor 712, while the second residue signal ($V_{resn}$) is buffered on the transistor 716. As the SAR ADC 700 enters the first phase of the ADC operation, switches 746, 748 are activated by the clock signal C1 and then switches 744, 750 are activated by the delayed clock signal C1d. This allows the residue signals ($V_{resp}$ and $V_{resn}$) buffered on the transistors 712, 716 to be stored onto the residue capacitors 780, 782. In the second phase of the ADC operation, switches 744, 746, 748, 750 are deactivated and switches 752, 754, 740, 742 are activated in sequence by the clock signals C2, C2d. The storage module 702 further includes a third source follower buffer 794 including a transistor 728 and a current source 732 and a fourth source follower buffer 796 including a transistor 730 and a current source 734. The activation of switches 752, 754, 740, 742 configures the storage module 702 such that the residue capacitors 780, 782 are in series with the analog differential input signals ($V_{ip}$ and $V_{in}$). Since the activation of switches 752, 754, 740, 742 couples the residue capacitors 780, 782 (which store the residue signals ($V_{resp}$ and $V_{resn}$)) with the analog differential input signals ($V_{ip}$ and $V_{in}$) and the first and second input terminals 790, 792, respectively, through the buffers 794, 796, this configuration has the effect of removing the residue signals ($V_{resp}$ and $V_{resn}$) from the analog differential input signals ($V_{ip}$ and $V_{in}$) and buffering/outputting the differences as the first and second input signals for the next phase.

Figure 8:
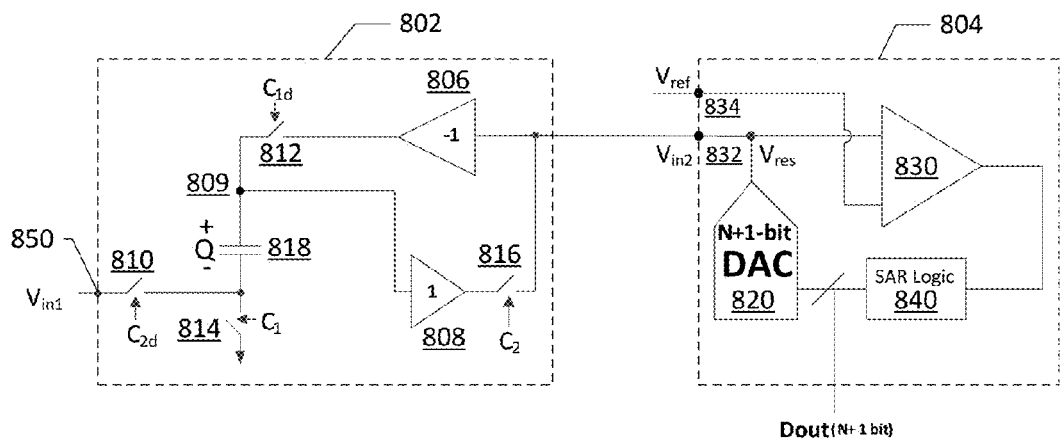
FIG. 8 is a functional block diagram of a noise shaping SAR ADC in accordance with a further embodiment of the present disclosure.

FIG. 8 is a functional block diagram of a noise shaping SAR ADC 800 in accordance with a further embodiment of the present disclosure. In one embodiment, FIG. 8 is a variation of FIG. 6 in which a switching configuration is changed.

In FIG. 6, part of the quantization noise at node 609 may be lost to the parasitic capacitances. Thus, in the illustrated embodiment of FIG. 8, the switching configuration is changed, wherein both buffers 806 and 808 are connected to the same side of the residue capacitor 818 (i.e., node 809 in FIG. 8). Therefore, the parasitic capacitance at node 809 is pre-charged with a quantization noise in the first phase of the ADC operation. This may result in a significantly improved noise shaping property.

In the illustrated embodiment of FIG. 8, the noise shaping SAR ADC 800 includes a noise shaping module 804 which compares a first input signal ($V_{in2}$) received at a first input terminal 832 to a second input signal ($V_{ref}$) received at a second input terminal 834. The noise shaping module 804 also outputs a digital output signal ($D_{out}$) and a residue signal ($V_{res}$) in a noise shaping operation. A binary search is performed by a comparator 630 and a SAR logic unit 640 to find a digital output signal ($D_{out}$). In FIG. 8, n+1 DAC operations are performed by a DAC 820. A quantization noise is left on the capacitor array of the DAC 820 after the (n+1)$^{th}$ DAC operation. The noise shaping SAR ADC 800 also includes a storage module 802 which stores the residue signal ($V_{res}$) during a first phase of the noise shaping operation. The storage module 802 also receives an analog input signal ($V_{in1}$) and removes the residue signal ($V_{res}$) from the analog input signal ($V_{in1}$) in a second phase of the noise shaping operation to output the first input signal ($V_{in2}$) to the noise shaping module 804.

In FIG. 8, the residue signal ($V_{res}$) output on the first input terminal 832 at the end of an n+1 bit DAC operation is buffered onto a buffer 806. As the SAR ADC 800 enters the first phase of the ADC operation, switch 814 is activated by the clock signal C1 and then switch 812 is activated by the delayed clock signal C1d. This allows the residue signal ($V_{res}$) buffered on the buffer 806 to be stored onto a residue capacitor 818. In one embodiment, the buffer 806 acts to isolate the residue capacitor 818 from the capacitors of the DAC 820. The activation of switch 812 also connects node 809 to a buffer 808 which has the effect of pre-charging node 809 with a quantization noise in the first phase of the ADC operation, which significantly improves the noise shaping property. In the second phase of the ADC operation, switches 812, 814 are deactivated and switches 816, 810 are activated in sequence by the clock signals C2, C2d. Thus, the activation of switches 816, 810 configures the storage module 802 such that the residue capacitor 818 is in series with the analog input signal ($V_{in1}$), which is received at the input terminal 850 of the SAR ADC 800. Further, the buffer 808 is coupled between node 809 and switch 816, which connects to the first input terminal 832. Since the activation of switches 816, 810 couples the residue capacitor 818 (which stores the residue signal ($V_{res}$) in the first phase) with the analog input signal ($V_{in1}$) and the first input terminal 832 through the buffer 808, this configuration has the effect of removing the residue signal ($V_{res}$) from the analog input signal ($V_{in1}$) and buffering/outputting the difference as the first input signal ($V_{in2}$) for the next phase.

Following connections are made in FIG. 8: switch 812 is coupled to buffer 806 and a first node (+ node) of the residue capacitor 818; switch 816 is coupled to buffer 808 and the first input terminal 832; switch 810 is coupled to the input terminal 850 and a second node (− node) of the residue capacitor 818; switch 814 is coupled to the second node of the residue capacitor 818 and a ground voltage; and buffer 808 is coupled to the switch 816 and the first node of the residue capacitor 818.

Figure 9:
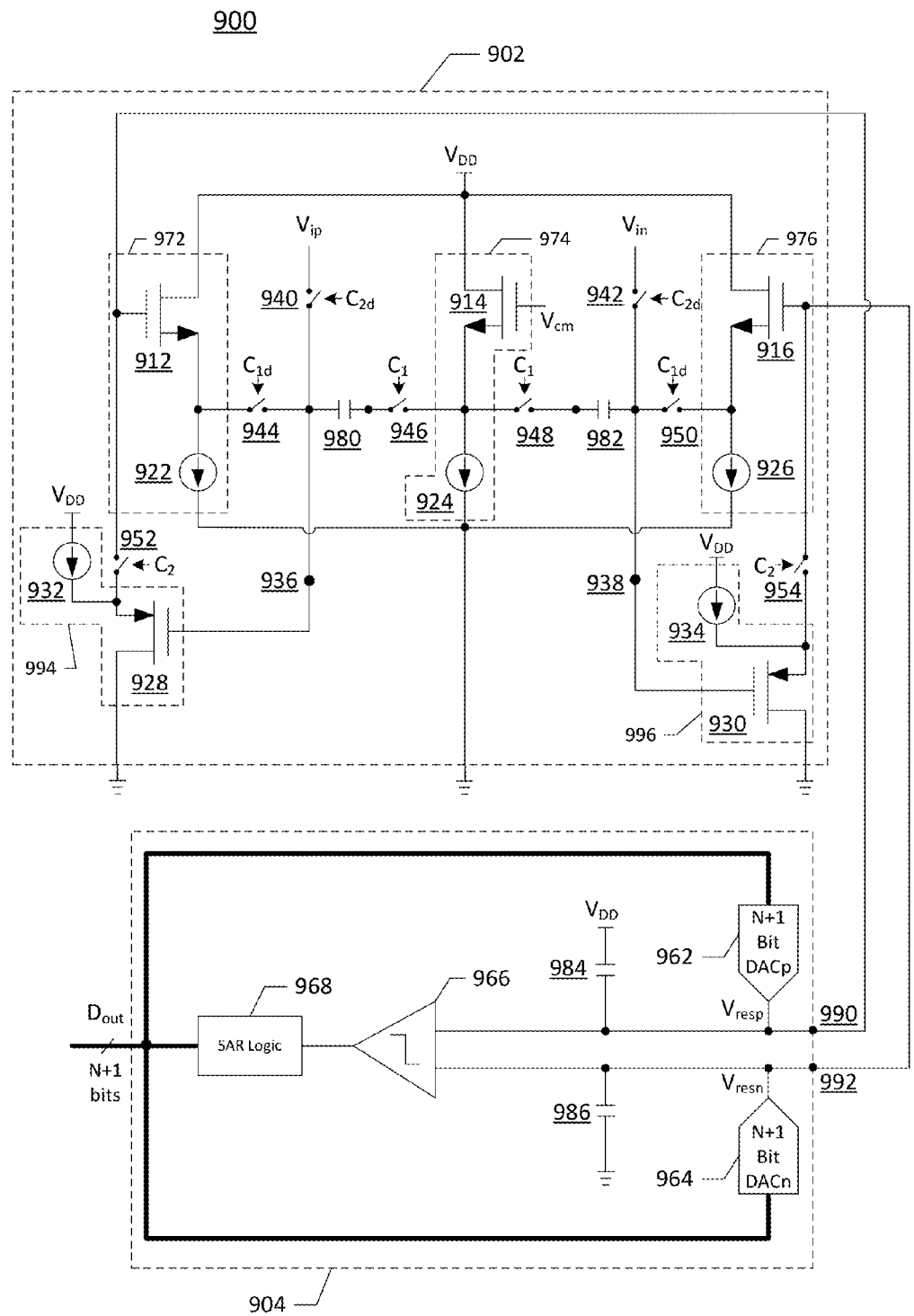
FIG. 9 is a circuit diagram of a SAR ADC in accordance with one embodiment of the present disclosure.

FIG. 9 is a circuit diagram of a SAR ADC 900 in accordance with one embodiment of the present disclosure. In one embodiment, the SAR ADC 900 of FIG. 9 is a differential circuit implementation of a SAR ADC 800 in FIG. 8.

In the illustrated embodiment of FIG. 9, the noise shaping SAR ADC 900 includes a noise shaping module 904 which compares a first input signal received at a first input terminal 990 to a second input signal received at a second input terminal 992. The first and second input signals form a differential signal. The noise shaping module 904 also outputs a digital output signal ($D_{out}$) and a pair of residue signals ($V_{resp}$ and $V_{resn}$) in a noise shaping operation. A binary search is performed by a comparator 966 and a SAR logic unit 968 to find a digital output signal ($D_{out}$). In FIG. 9, two n+1 DAC operations are performed by a DAC for a positive signal (DACp) 962 and a DAC for a negative signal (DACn) 964. A quantization noise is left on each of the capacitor arrays of the DACp 962 and the DACn 964 after the (n+1)$^{th}$ DAC operation. The SAR ADC 900 also includes a storage module 902 which stores the residue signals ($V_{resp}$ and $V_{resn}$) during a first phase of the noise shaping operation and removes the residue signals ($V_{resp}$ and $V_{resn}$) stored during the first phase from analog differential input signals ($V_{ip}$ and $V_{in}$) in a second phase of the noise shaping operation. The results are output to the first and second input terminals 990, 992 as the first and second input signals.

In the storage module 902, a transistor 912 and a current sink 922 form a first source follower buffer 972 for the first input signal (i.e., the positive input of the differential signals) and a transistor 916 and a current sink 926 form a second source follower buffer 976 for the second input signal (i.e., the negative input of the differential signals). One additional source follower buffer 974 is formed by a transistor 914 and a current sink 924 to provide a common-mode signal for the pair of differential signals. The storage module 902 also includes residue capacitors 980, 982 which store the residue signals ($V_{resp}$ and $V_{resn}$) output by the DACp 962 and the DACn 964 after the (n+1)$^{th}$ DAC operation. The residue capacitors 980, 982 may be significantly larger (e.g., ten times larger) than the total capacitance on the differential input nodes (i.e., first and second input terminals 990, 992) which can substantially reduce the coefficient mismatch. Thus, the residue capacitors 980, 982 may not need to be of the same type as the capacitors for the DACp 962, DACn 964. Further, the area penalty can be relatively small compared to the size of the SAR ADC. In some embodiments, additional external capacitors 984, 986 can be coupled to the first and second input terminals 990, 992.

In FIG. 7, part of the quantization noise at nodes 736 and 738 is lost to the parasitic capacitances. Thus, in the illustrated embodiment of FIG. 9, the switching configuration is changed, wherein both buffers 972 and 994 are connected to the same side of the residue capacitor 980 (i.e., node 936 in FIG. 9) and both buffers 976 and 996 are connected to the same side of the residue capacitor 982 (i.e., node 938 in FIG. 9). Therefore, the parasitic capacitances at nodes 936, 938 are pre-charged with a quantization noise in the first phase of the ADC operation. This may result in a significantly improved noise shaping property.

In operation, the residue signals ($V_{resp}$ and $V_{resn}$) output on the first input terminal 990 and the second input terminal 992, respectively, at the end of the two n+1 bit DAC operations (performed by DACp 762 and DACn 764, respectively) are buffered onto the first source follower buffer 972 and the second source follower buffer 976, respectively. That is, the first residue signal ($V_{resp}$) is buffered on the transistor 912, while the second residue signal ($V_{resn}$) is buffered on the transistor 916. As the SAR ADC 900 enters the first phase of the ADC operation, switches 946, 948 are activated by the clock signal C1 and then switches 944, 950 are activated by the delayed clock signal C1d. This allows the residue signals ($V_{resp}$ and $V_{resn}$) buffered on the transistors 912, 916 to be stored onto the residue capacitors 980, 982. In the second phase of the ADC operation, switches 944, 946, 948, 950 are deactivated and switches 952, 954, 940, 942 are activated in sequence by the clock signals C2, C2d. The storage module 902 further includes a third source follower buffer 994 including a transistor 928 and a current source 932 and a fourth source follower buffer 996 including a transistor 930 and a current source 934. The activation of switches 952, 954, 940, 942 configures the storage module 902 such that the residue capacitors 980, 982 are in series with the analog differential input signals ($V_{ip}$ and $V_{in}$). Since the activation of switches 952, 954, 940, 942 couples the residue capacitors 980, 982 (which store the residue signals ($V_{resp}$ and $V_{resn}$)) with the analog differential input signals ($V_{ip}$ and $V_{in}$) and the first and second input terminals 990, 992, respectively, through the buffers 994, 996, this configuration has the effect of removing the residue signals ($V_{resp}$ and $V_{resn}$) from the analog differential input signals ($V_{ip}$ and $V_{in}$) and buffering/outputting the differences as the first and second input signals for the next phase.

In some embodiments, the configurations of the noise shaping SAR ADCs can be extended to a sigma-delta modulator (SDM; sometimes referred to as a sigma-delta ADC). For example, one of the noise shaping SAR ADCs described in FIG. 3 through FIG. 9 can be used as a quantizer in the SDM.

Figure 10:
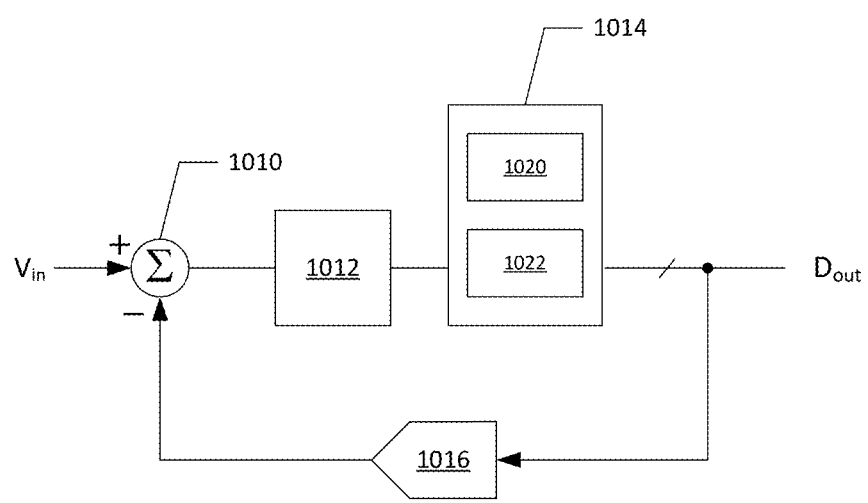
FIG. 10 is a functional block diagram of a sigma-delta modulator (SDM) in accordance with one embodiment of the present disclosure.

FIG. 10 is a functional block diagram of a sigma-delta modulator (SDM) 1000 in accordance with one embodiment of the present disclosure. In the illustrated embodiment of FIG. 10, the SDM 1000 includes an adder 1010, a loop filter 1012, a quantizer 1014, and a digital-to-analog converter (DAC) 1016. The adder 1010 is configured to receive an analog input signal and a feedback signal and generate a difference signal. The loop filter 1012 is configured to integrate the difference signal to a value to be quantized. The quantizer 1014 is configured to receive the integrated signal and generate a digital signal which is an approximation of the analog input signal. In the illustrated embodiment, the quantizer 1014 includes a noise shaping module 1020 configured to receive the integrated signal and output a quantization error signal in a noise shaping operation. The quantizer 1014 also includes a sample-and-hold module 1022 configured to store the quantization error signal during a first phase of the noise shaping operation, the sample-and-hold module configured to receive the integrated signal from the loop filter and remove the quantization error signal from the integrated signal in a second phase of the noise shaping operation. In one embodiment, one of the noise shaping SAR ADCs described in FIG. 3 through FIG. 9 can be used as a quantizer in the SDM. The DAC 1016 receives the digital output of the quantizer 1014, and converts it to an analog form. In FIG. 10, the analog form of the digital output is fed back, and combined with the analog input signal (e.g., subtracted).

Although several embodiments of the disclosure are described above, many variations of the disclosure are possible. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the disclosure. In addition, the grouping of functions within a module, block, or step is for ease of description. Specific functions or steps can be moved from one module or block without departing from the disclosure.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. An analog-to-digital converter (ADC), comprising:
 a first input terminal to receive a first input signal;
 a second input terminal to receive a second input signal;
 a noise shaping module configured to compare the first input signal to the second input signal received, and to output a digital output signal and a residue signal in a first phase of a noise shaping operation;
 a storage module comprising a first residue capacitor having first and second nodes and a first buffer coupled to the first input terminal, the storage module configured to store the residue signal during the first phase of the noise shaping operation, the storage module configured to receive an analog input signal and remove the residue signal from the analog input signal in a second phase of the noise shaping operation to output a new first input signal to the noise shaping module,
 a first switch coupled to the first buffer and the first node of the first residue capacitor, the first switch during the first phase of the noise shaping operation; and
 a second switch coupled to the first input terminal and the second node of the first residue capacitor, the second switch configured to place the first residue capacitor in series with the analog input signal in the second phase of the noise shaping operation.

2. The ADC of claim 1, wherein the noise shaping module further comprises
 a digital-to-analog converter (DAC) coupled to the first input terminal and configured to perform DAC operations on the digital output signal until only the residue signal is left on the DAC, and the residue signal is output to the first input terminal.

3. The ADC of claim 1, wherein the first buffer is configured to buffer and store the residue signal on the residue capacitor.

4. The ADC of claim 3, first switch is configured to enable storage of the residue signal on the first residue capacitor during the first phase of the noise shaping operation.

5. The ADC of claim 4, wherein the second switch is to remove the residue signal from the analog input signal in the second phase of the noise shaping operation.

6. The ADC of claim 1, further comprising:
an input node configured to receive the analog input signal;
a third switch coupled to the input node and the first node of the first residue capacitor; and
a fourth switch coupled to the second node of the first residue capacitor and a ground voltage.

7. The ADC of claim 1, further comprising
a second buffer disposed between the second switch and the first input terminal.

8. The ADC of claim 1, further comprising:
a second buffer coupled to the first node of the first residue capacitor; and
the second switch is also coupled to the second buffer.

9. The ADC of claim 8, further comprising:
an input node configured to receive the analog input signal;
a third switch coupled to the input node and the second node of the first residue capacitor; and
a fourth switch coupled to the second node of the first residue capacitor and a ground voltage.

10. The ADC of claim 1, wherein the second input signal is a reference voltage.

11. The ADC of claim 10, wherein the noise shaping module comprises
a comparator configured to compare the first input signal to the reference voltage in the noise shaping operation to output the digital output signal.

12. The ADC of claim 1, wherein the first input signal and the second input signal comprise a pair of differential signals.

13. The ADC of claim 1, wherein the residue signal comprises positive and negative residue signals.

14. The ADC of claim 13, wherein the storage module further comprises:
a second residue capacitor; and
first and second buffers coupled to the first and second input terminals and configured to buffer and store the positive and negative residue signals on the first and second residue capacitors, respectively.

15. The ADC of claim 14, wherein the first buffer comprises a first source follower configuration including a first transistor and a first current sink, and the second buffer comprises a second source follower configuration including a second transistor and a second current sink.

16. The ADC of claim 15, wherein gate terminals of the first and second transistors are coupled to the first and second input terminals, respectively, and source terminals of the first and second transistors are coupled to the first and second current sinks, respectively.

17. The ADC of claim 15, further comprising
a first pair of switches coupled to source terminals of the first and second transistors and the first and second residue capacitors, the first pair of switches configured to enable storage of the positive and negative residue signals on the first and second residue capacitors during the first phase of the noise shaping operation.

18. The ADC of claim 17, wherein the analog input signal comprises a positive analog signal and a negative analog signal.

19. The ADC of claim 18, further comprising
a second pair of switches coupled to the first and second input terminals and the first and second residue capacitors, the second pair of switches configured to place the first and second residue capacitors in series with the positive and negative analog signals to remove the positive and negative residue signals, respectively, from the positive and negative analog signals, respectively, in the second phase of the noise shaping operation.

20. The ADC of claim 19, further comprising:
positive and negative analog input nodes configured to receive the positive and negative analog signals;
a third pair of switches coupled to the positive and negative analog input node and the first and second residue capacitors;
a third current sink;
a common-mode transistor coupled to the third current sink; and
a fourth pair of switches coupled to the first and second residue capacitors and a gate terminal of the common-mode transistor.

21. The ADC of claim 19, further comprising
third and fourth buffers disposed between the second pair of switches and the first and second residue capacitors, respectively.

22. The ADC of claim 21, wherein the third buffer comprises a third source follower configuration including a first current source and a third transistor, and the fourth buffer comprises a fourth source follower configuration including a second current source and a fourth transistor.

23. A successive approximation register (SAR) loop configured to perform noise shaping in an analog-to-digital converter (ADC), the SAR loop comprising:
a comparator including first and second input terminals configured to receive first and second input signals, and an output terminal configured to output an output signal;
a SAR logic unit coupled to the output terminal of the comparator and configured to perform a noise shaping operation on the output signal until only a residue signal is left on the first input terminal;
a storage module configured to store the residue signal during a first phase of the noise shaping operation, the storage module configured to receive an analog input signal and remove the residue signal from the analog input signal in a second phase of the noise shaping operation to output a new first input signal to the first input terminal,
wherein the storage module comprises a residue capacitor having first and second nodes; and a first buffer coupled to the first input terminal and configured to buffer and store the residue signal on the residue capacitor;
a first switch coupled to the first buffer and the first node of the residue capacitor, the first switch configured to enable storage of the residue signal on the residue capacitor during the first phase of the noise shaping operation; and
a second switch coupled to the first input terminal and the second node of the residue capacitor, the second switch configured to place the residue capacitor in series with the analog input signal to remove the residue signal from the analog input signal in the second phase of the noise shaping operation.

24. A sigma-delta modulator (SDM) comprising:
a loop filter configured to receive and integrate an input signal and output a first integrated signal; and
a quantizer including:
a noise shaping module configured to receive the first integrated signal and output a quantization error signal at a first input terminal in a noise shaping operation;
a sample-and-hold module configured to store the quantization error signal during a first phase of the noise shaping operation, the sample-and-hold module configured to receive a second integrated signal from the loop filter and remove the quantization error signal from the second integrated signal in a second phase of the noise shaping operation, wherein the sample-and-hold module comprises a first residue capacitor having first and second nodes; and a first buffer coupled to the first input terminal and configured to buffer and store the quantization error signal on the first residue capacitor;

a first switch coupled to the first buffer and the first node of the residue capacitor, the first switch configured to enable storage of the quantization error signal on the residue capacitor during the first phase of the noise shaping operation; and a second switch coupled to the first input terminal and the second node of the residue capacitor, the second switch configured to place the residue capacitor in series with the second integrated signal to remove the quantization error signal from the second integrated signal in the second phase of the noise shaping operation.

25. The SDM of claim 24, wherein the noise shaping module comprises:

a comparator including the first input terminal and a second input terminal configured to receive the first integrated signal and a reference signal, respectively, and an output terminal configured to output an output signal; and a SAR logic unit coupled to the output terminal of the comparator and configured to perform the noise shaping operation on the output signal until only the quantization error signal is left on the first input terminal of the comparator.

26. An apparatus for performing noise shaping in an analog-to-digital converter (ADC), the apparatus comprising:

means for comparing a first received input signal to a second received input signal using a noise shaping module;

means for outputting a digital output signal and a residue signal in a first phase of a noise shaping operation;

means for storing the residue signal during the first phase of the noise shaping operation in a storage module, wherein the means for storing comprises: a residue capacitor having first and second nodes; and a buffer configured to buffer the residue signal on the residue capacitor;

means for removing the residue signal from an analog input signal in a second phase of the noise shaping operation to output a new first input signal;

first means for switching coupled to the buffer and the first node of the residue capacitor, the first means for switching configured to enable storage of the residue signal on the residue capacitor during the first phase of the noise shaping operation; and second means for switching coupled to the second node of the residue capacitor, the second means for switching configured to place the residue capacitor in series with the analog input signal to remove the residue signal from the analog input signal in the second phase of the noise shaping operation.

27. The apparatus of claim 26, the apparatus further comprising means for performing digital-to-analog converter (DAC) operations on the digital output signal until only the residue signal is left on a DAC of the noise shaping module.

* * * * *